(12) United States Patent
Turkewadikar et al.

(10) Patent No.: US 11,940,826 B2
(45) Date of Patent: Mar. 26, 2024

(54) INDUCTOR DETECTION

(71) Applicant: Texas Instruments Incorporated, Dallas, TX (US)

(72) Inventors: Sachin Sudhir Turkewadikar, Bangalore (IN); Nitin Agarwal, Bangalore (IN); Madhan Radhakrishnan, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/572,692

(22) Filed: Jan. 11, 2022

(65) Prior Publication Data

US 2022/0129024 A1    Apr. 28, 2022

Related U.S. Application Data

(63) Continuation of application No. 16/689,545, filed on Nov. 20, 2019, now Pat. No. 11,256,276, which is a
(Continued)

(51) Int. Cl.
*H02M 3/158* (2006.01)
*G05F 1/56* (2006.01)
(Continued)

(52) U.S. Cl.
CPC .............. *G05F 1/56* (2013.01); *H02M 1/0045* (2021.05); *G01R 31/2813* (2013.01); *H02M 3/158* (2013.01)

(58) Field of Classification Search
CPC ..... G05F 1/56; H02M 1/0009; H02M 1/0045; H02M 3/158
See application file for complete search history.

(56) References Cited

U.S. PATENT DOCUMENTS 5,760,614 A * 6/1998 Ooishi ..................... H03K 5/08
                                                        327/81
5,909,365 A * 6/1999 Merwin ............... H02M 3/1563
                                                       363/126
(Continued)

FOREIGN PATENT DOCUMENTS

CN          101136591 A      3/2008
CN          101645651 A      2/2010
(Continued)

OTHER PUBLICATIONS

Frisina, F., et al. (1999). Transistors, Bipolar Junction. In Wiley Encyclopedia of Electrical and Electronics Engineering, J.G. Webster (Ed.). https://doi.org/10.1002/047134608X.W5813 (Year: 1999).*

(Continued)

*Primary Examiner* — Fred E Finch, III
(74) *Attorney, Agent, or Firm* — Michael T. Gabrik; Frank D. Cimino

(57) ABSTRACT

A power control integrated circuit (IC) chip can include a direct current (DC)-DC converter that outputs a switching voltage in response to a switching output enable signal. The power control IC chip can also include an inductor detect circuit that detects whether an inductor is conductively coupled to the DC-DC converter and a powered circuit component in response to an inductor detect signal. The power control IC chip can further include control logic that (i) controls the inductor detect signal based on an enable DC-DC signal and (ii) controls the switching output enable signal provided to the DC-DC converter and a linear output disable signal provided to a linear regulator based on a signal from the inductor detect circuit indicating whether the inductor is conductively coupled to the DC-DC converter and the powered circuit component.

17 Claims, 4 Drawing Sheets

Related U.S. Application Data continuation of application No. 15/710,883, filed on Sep. 21, 2017, now Pat. No. 10,534,387, which is a continuation of application No. 15/088,612, filed on Apr. 1, 2016, now Pat. No. 9,804,617.

(60) Provisional application No. 62/257,832, filed on Nov. 20, 2015.

(51) Int. Cl.
*H02M 1/00* (2006.01)
*G01R 31/28* (2006.01)

(56) References Cited

U.S. PATENT DOCUMENTS

| | | | |
|---|---|---|---|
| 7,733,671 B2 | 6/2010 | Chen et al. | |
| 8,867,245 B1* | 10/2014 | Hwang | H02M 1/4225 363/21.04 |
| 9,804,617 B2 | 10/2017 | Turkewadikar | |
| 10,534,387 B2 | 1/2020 | Turkewadikar | |
| 2006/0022653 A1 | 2/2006 | Reed | |
| 2006/0158165 A1 | 7/2006 | Inn | |
| 2006/0197516 A1 | 9/2006 | Chiu et al. | |
| 2007/0076452 A1 | 4/2007 | Schultz | |
| 2007/0139020 A1 | 6/2007 | Johnson et al. | |
| 2007/0279024 A1 | 12/2007 | Falvey et al. | |
| 2007/0290657 A1 | 12/2007 | Cretella | |
| 2008/0024103 A1 | 1/2008 | Komiya | |
| 2008/0158918 A1 | 7/2008 | Hunter | |
| 2008/0197828 A1 | 8/2008 | Michishita | |
| 2009/0021227 A1* | 1/2009 | Sase | H02M 1/36 323/283 |
| 2009/0309559 A1 | 12/2009 | Xia et al. | |
| 2010/0123443 A1 | 5/2010 | Grimm | |
| 2011/0006728 A1 | 1/2011 | Kung | |
| 2011/0068762 A1* | 3/2011 | Nishida | G01R 19/0092 323/282 |
| 2011/0204860 A1* | 8/2011 | Thiele | H02M 3/156 323/271 |
| 2012/0146599 A1* | 6/2012 | Oyama | H02M 3/156 327/79 |
| 2012/0161732 A1 | 6/2012 | Renton et al. | |
| 2012/0223687 A1 | 9/2012 | Liu | |
| 2013/0021012 A1 | 1/2013 | Oddoart et al. | |
| 2013/0147446 A1 | 6/2013 | Kris et al. | |
| 2013/0328854 A1 | 12/2013 | Ruan et al. | |
| 2014/0062440 A1 | 3/2014 | Garrett | |
| 2014/0111169 A1 | 4/2014 | Polarouthu et al. | |
| 2014/0253062 A1* | 9/2014 | Qin | G05F 1/10 323/282 |
| 2014/0300329 A1* | 10/2014 | Thompson | H02M 3/156 327/79 |
| 2014/0320104 A1* | 10/2014 | Guo | H02M 3/158 323/290 |
| 2015/0022248 A1* | 1/2015 | Fukami | H01L 27/088 327/110 |
| 2015/0097535 A1 | 4/2015 | Schmeller et al. | |
| 2015/0214827 A1 | 7/2015 | Yoon et al. | |
| 2015/0234402 A1 | 8/2015 | Kay et al. | |
| 2016/0036330 A1 | 2/2016 | Strurcken et al. | |
| 2016/0172973 A1 | 6/2016 | Rince et al. | |
| 2016/0190926 A1 | 6/2016 | Ni et al. | |
| 2016/0239036 A1 | 8/2016 | Paillet | |
| 2017/0010316 A1* | 1/2017 | Gerna | H02M 3/156 327/79 |
| 2017/0160756 A1 | 6/2017 | Hsieh | |
| 2018/0083535 A1 | 3/2018 | Ni et al. | |

FOREIGN PATENT DOCUMENTS

| | | |
|---|---|---|
| CN | 102655370 A | 9/2012 |
| CN | 102834998 A | 12/2012 |
| CN | 103780090 A | 5/2014 |
| CN | 104054246 A | 9/2014 |
| CN | 104348359 A | 2/2015 |
| CN | 104541221 A | 4/2015 |
| CN | 104578780 A | 4/2015 |
| CN | 204244074 U | 4/2015 |
| CN | 104753344 A | 7/2015 |
| JP | H11164550 A | 6/1999 |
| KR | 20120056456 A | 6/2012 |

OTHER PUBLICATIONS

Kaplan, S.M., Entry for "couple," in Wiley Electrical and Electronics Engineering Dictionary. Hoboken, NJ, USA: Wiley, 2004, p. 151. (Year: 2004).*
International Search Report and Written Opinion dated Feb. 7, 2018, PCT Application No. PCT/US2017/059527, 7 bages.
Notification of First Office Action dated Sep. 25, 2019, Chinese Application No. 201611025016.3, 17 pages.

* cited by examiner

INDUCTOR DETECTION

CROSS REFERENCE TO RELATED APPLICATIONS

This application is a Continuation of U.S. patent application Ser. No. 16/689,545 filed Nov. 20, 2019, which is a Continuation of U.S. patent application Ser. No. 15/710,883 filed Sep. 21, 2017 (now U.S. Pat. No. 10,534,387), which is a Continuation of U.S. patent application Ser. No. 15/088,612 filed Apr. 1, 2016 (now U.S. Pat. No. 9,804,617), which claims the benefit of priority to the U.S. Provisional Patent Application entitled "NOVEL SCHEME OF LDO TO DCDC TRANSITION WITH INDUCTOR DETECT FEATURE," Provisional Patent Application No. 62/257,832, filed on Nov. 20, 2015, which is incorporated herein by reference in its entirety.

TECHNICAL FIELD

This disclosure relates to systems and methods for detecting an inductor. More particularly, this disclosure relates to systems and method for detecting an inductor coupled to a power control circuit.

BACKGROUND

A DC-to-DC (or simply "DC-DC") converter is an electronic circuit that converts a source of direct current (DC) from one voltage level to another. A DC-DC converter is a class of power converter. A low-dropout (LDO) regulator is a linear DC voltage regulator that can regulate the output voltage even when the supply voltage is very close to the output voltage. As compared to a DC-DC converter, a disadvantage is that, unlike DC-DC converters, linear DC regulators must dissipate power across the regulation device in order to regulate the output voltage. The advantages of LDO regulators over other DC-to-DC converters include a smaller device size as neither large inductors nor transformers are needed.

SUMMARY

Systems and methods are described for detecting an inductor. More particularly, systems and methods are described for detecting an inductor coupled to a power control circuit.

One example relates to a power control integrated circuit (IC) chip. The power control IC chip can include a direct current (DC)-DC converter that outputs a switching voltage in response to a switching output enable signal. The power control IC chip can also include an inductor detect circuit that detects whether an inductor is conductively coupled to the DC-DC converter and a powered circuit component in response to an inductor detect signal. The power control IC chip can further include control logic that (i) controls the inductor detect signal based on an enable DC-DC signal and (ii) controls the switching output enable signal provided to the DC-DC converter and a linear output disable signal provided to a linear regulator based on a signal from the inductor detect circuit indicating whether the inductor is conductively coupled to the DC-DC converter and the powered circuit component.

Another example relates to an inductor detect circuit that can include a given transistor. The given transistor can include a control node that receives an enable inductor detection signal. The given transistor can also include an input node coupled to an output of a DC-DC converter and an output node coupled to a resistor. The inductor detect circuit can also include another transistor that can include a control node coupled to the resistor and the output node of the given transistor. The other transistor can also include an input node coupled to a constant current source and an input of a logic component, and an output node coupled to an electrically neutral node. An output of the logic component can provide an inductor detect signal that indicates whether the inductor detect circuit detects an inductor coupled to the output of the DC-DC converter.

Yet another example relates to a method that can include operating a power control circuit in a low-dropout (LDO) mode. The method can also include receiving, at the power control circuit an enable direct current (DC)-DC signal. The method can further include detecting a presence or absence of an inductor coupled to the DC-DC converter in response to the enable DC-DC signal. The method can still further include activating a DC-DC converter in response to detecting that the inductor is present.

DETAILED DESCRIPTION

Systems and methods are described for detecting the presence or absence of an inductor coupled to a power control circuit (e.g., an integrated circuit chip) and transitioning between a low dropout (LDO) mode to a direct current (DC)-DC mode and vice versa. In particular, the systems and methods described herein include an inductor detect circuit that can detect whether current flows through the inductor to detect the presence or absence of the inductor. If the inductor is present, the power control circuit can operate in the DC-DC mode. If the inductor is not present, the power control circuit can operate in the LDO mode.

Figure 1:
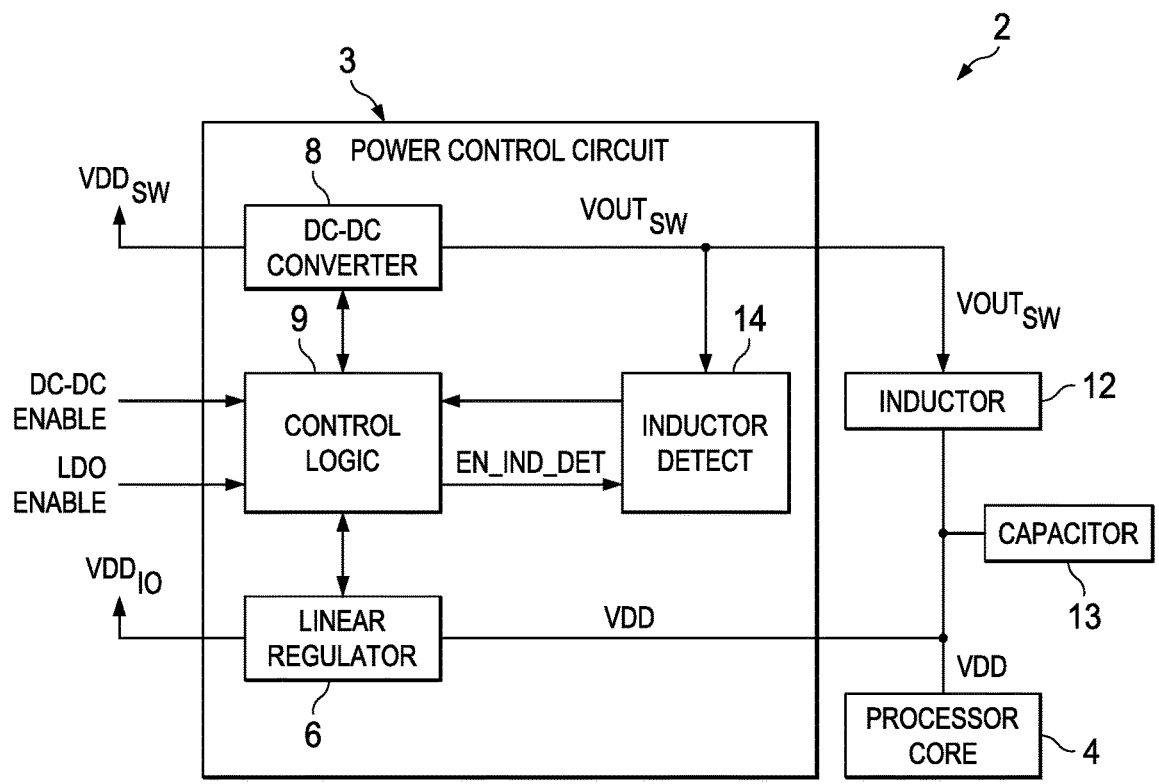
FIG. 1 illustrates a block diagram of a system with power control circuit employed to control a power signal provided to a processor core.

FIG. 1 illustrates a block diagram of a system 2 with a power control circuit 3 that could be employed to control a power signal (labeled in FIG. 1 as "VDD") provided to a processor core 4. The power control circuit 3 can be implemented on an integrated circuit (IC) chip. In some examples, the power control circuit 3 can be mounted on a circuit board. The power signal (VDD) provided to the processor core 4 can be either a low-dropout (LDO) voltage signal (labeled in FIG. 1 as "VDD") provided from a linear regulator 6 or a switched voltage signal (labeled in FIG. 1 as "$VOUT_{SW}$") output by a DC-DC converter 8. The linear regulator 6 can be a LDO regulator.

The DC-DC converter 8 can be driven by a DC supply voltage (labeled in FIG. 1 as "$VDD_{SW}$"). Additionally, the linear regulator 6 can be driven by another DC supply voltage, labeled in FIG. 1 as "$VDD_{IO}$". In some examples, $VDD_{SW}$ and $VDD_{IO}$ can be supplied from a common power source (e.g., a shorted source) of the circuit board on which the power control circuit 3 is mounted. An inductor 12 can be coupled between the processor core 4 and the DC-DC converter 8. Moreover, a capacitor 13 can be coupled to the inductor 12 and the processor core 4. Additionally, the processor core 4 can be coupled to the linear regulator 6. The processor core 4 can be driven (e.g., powered) by a DC voltage, such that the power signal (VDD) can be provided from either the DC-DC converter 8 (via the inductor 12) or the linear regulator 6. Thus, the power control circuit 3 can operate in two different modes, namely an LDO mode where the processor core 4 is powered by the output of the linear regulator 6 (VDD) and a DC-DC mode where the processor core 4 is powered by the output of the DC-DC converter 8 ($VOUT_{SW}$) via the inductor 12.

The power control circuit 3 can include control logic 9 that can activate and deactivate the DC-DC converter 8 and the linear regulator 6 in response to various control signals provided from an external control unit, including a power management module (PMM) or other unit. For example, the control logic 9 can receive an LDO enable signal (labeled in FIG. 1 as "LDO ENABLE") from the external control unit. In response, the control logic 9 can cause the linear regulator to provide the LDO voltage signal (VDD). In some examples, the system 2 can be configured such that, upon an initial startup, the LDO enable signal is asserted (e.g., turned high), such that the processor core 4 is driven by the linear regulator 6 and the power control circuit 3 operates in the LDO mode.

To achieve improved power efficiency, the system 2 can be configured to attempt to transition from the LDO mode to the DC-DC mode. To transition to the DC-DC mode, an enable DC-DC signal (labeled in FIG. 1 as "DC-DC ENABLE") can be asserted (e.g., turned high) by the external control unit and the enable DC-DC signal (DC-DC ENABLE) can be received by the control logic 9.

The system 2 can be implemented in an environment that experiences significant mechanical vibrations, such as an automotive vehicle or an industrial tools environment. For instance, the processor core 4 can be, for example, a micro-controller unit (MCU) of an automotive vehicle or a control unit of an industrial control system. In any such situation, there is a chance that (due to the mechanical vibrations), the inductor 12 may become disconnected from the DC-DC converter 8 and/or the processor core 4. In this situation, there is no conductive path between the DC-DC converter 8 and the processor core 4.

In response to the enable DC-DC signal (DC-DC ENABLE) being asserted (e.g., turned high), the control logic 9 can assert (e.g., turn high) an enable inductor detect signal (labeled in FIG. 1 as "EN_IND_DET") that is provided to an inductor detect circuit 14 of the power control circuit 3. In response to the enable inductor detect signal (EN_IND_DET) being asserted (e.g., turned high), the inductor detect circuit 14 can determine if the inductor 12 is still conductively coupled to the DC-DC converter 8 and the processor core 4, which can be referred to as detecting that the inductor 12 is present. If the inductor detect circuit 14 detects that the inductor 12 is present, the inductor detect circuit 14 can return an asserted (e.g., high) inductor detect signal to the control logic 9. As explained herein, the inductor detect signal returned by the inductor detect circuit 14 can be a "raw inductor detect signal" that may have a transient false detection of the inductor 12. Accordingly, the signal output by the inductor detect circuit 14 is filtered and processed by the control logic 9 in a manner described herein to reduce or eliminate the chances of a false detection of the inductor 12. If the inductor detect circuit 14 detects that the inductor 12 is not present, thereby indicating that the inductor 12 has been conductively decoupled (e.g., due to mechanical vibrations) from the DC-DC converter 8 and/or the processor core 4, the inductor detect circuit 14 does not assert the inductor detect signal (e.g., the inductor detect signal is low).

In response to both the enable DC-DC signal (DC-DC ENABLE) and the inductor detect signal from the inductor detect circuit 14 being asserted (turned high), the control logic 9 can provide an asserted (e.g., turned high) enable DC-DC driver signal to the DC-DC converter 8 to activate (e.g., turn on) the switched voltage signal ($VOUT_{SW}$). In some examples, in response to detecting that the inductor detect signal is not asserted (e.g., low), indicating that the inductor 12 is not present, the control logic 9 can send de-assert (turned or kept low) enable DC-DC driver signal to the DC-DC converter 8 that causes the DC-DC converter 8 to disable (or not enable) the switching output voltage signal ($VOUT_{SW}$). Alternatively, in response to detecting that both the enable DC-DC signal (DC-DC ENABLE) and the inductor detect signal is asserted (e.g., turned high), indicating that the inductor 12 is present, the control logic 9 can provide a disable (turn off) linear voltage signal to the linear regulator 6. In response, the linear regulator 6 can disable the linear power output (VDD), such that the processor core 4 is powered by the switching output ($VOUT_{SW}$) via the inductor 12, thereby completing the transitioning of the power control circuit 3 from the LDO mode to the DC-DC mode.

Periodically and/or asynchronously, the system 2 may initiate a power reset procedure. In such a situation, the enable DC-DC signal can be de-asserted (e.g., turned low), thereby causing the control logic 9 to signal the DC-DC converter to disable the switching output ($VOUT_{SW}$) and the LDO enable signal can be asserted (e.g., turned high), thereby causing the LDO output to be provided to the processor core 4 as VDD, and causing the power control circuit 3 to transition to the LDO mode.

After the power reset, the external control unit may re-assert (e.g., turn high) the enable DC-DC signal in an attempt to re-transition the power control circuit 3 to the DC-DC mode in the manner described. In this manner, in the event that the inductor 12 is conductively decoupled from the DC-DC converter 8 and/or the processor core 4 while the power control circuit 3 is already operating in the DC-DC mode, the power control circuit 3 can be transitioned to the LDO mode.

By employment of this system 2, the power control circuit 3 can operate in two different power modes, namely, the LDO mode and the DC-DC mode. Moreover, the power control circuit 3 can be configured to prevent transitioning to the DC-DC mode in situations where the inductor 12 is not present, which would indicate that the inductor 12 has been conductively decoupled from the processor core and/or the DC-DC converter 8. Moreover, the inductor detect circuit 14 can detect the presence (or absence) of the inductor 12 automatically, thereby avoiding the need for visual inspection of the system 2 to determine if the inductor 12 has been conductively decoupled from the processor core 4 and/or the DC-DC converter 8.

Figure 2:
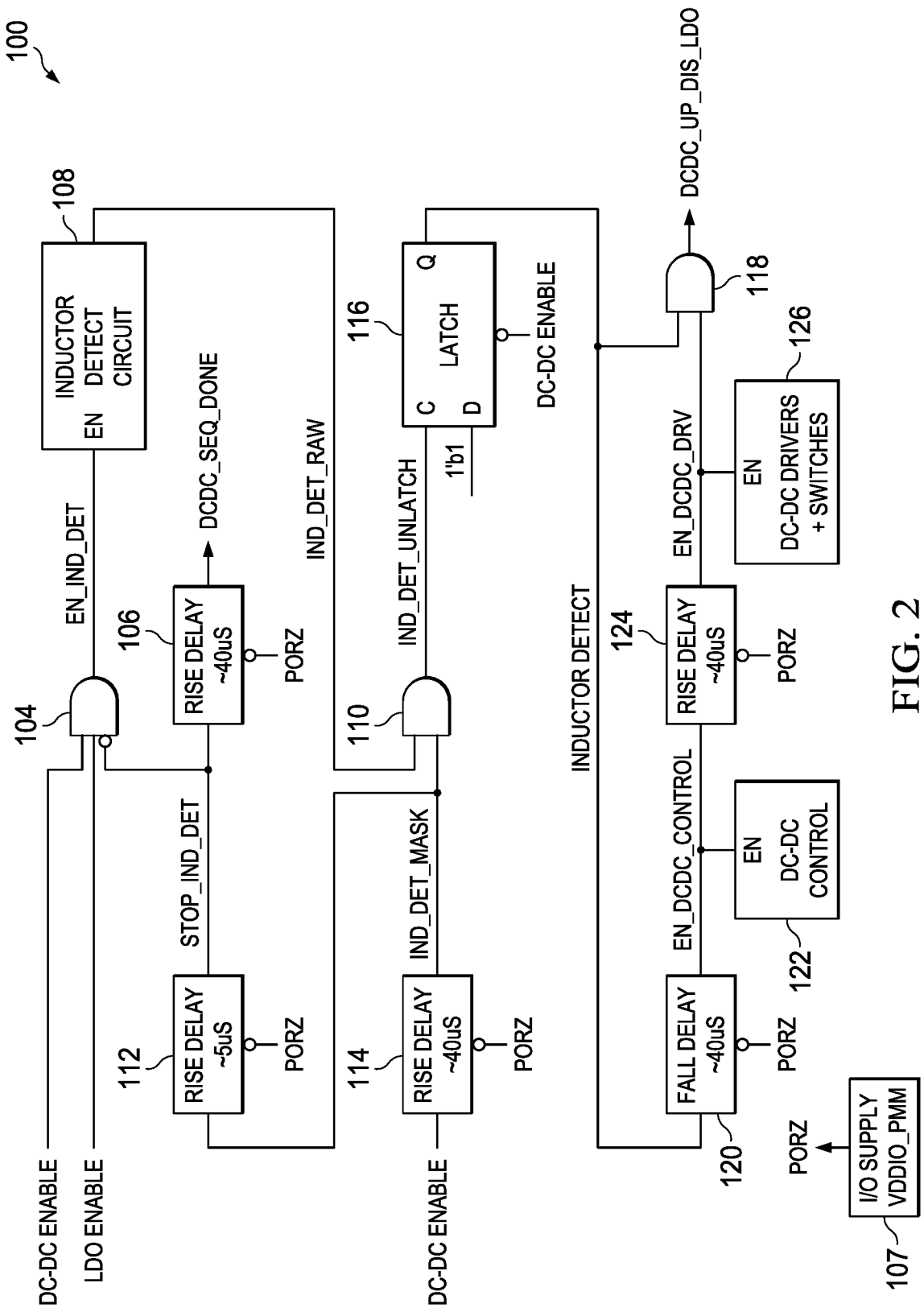
FIG. 2 illustrates a logic circuit for controlling a power control circuit.
Figure 3:
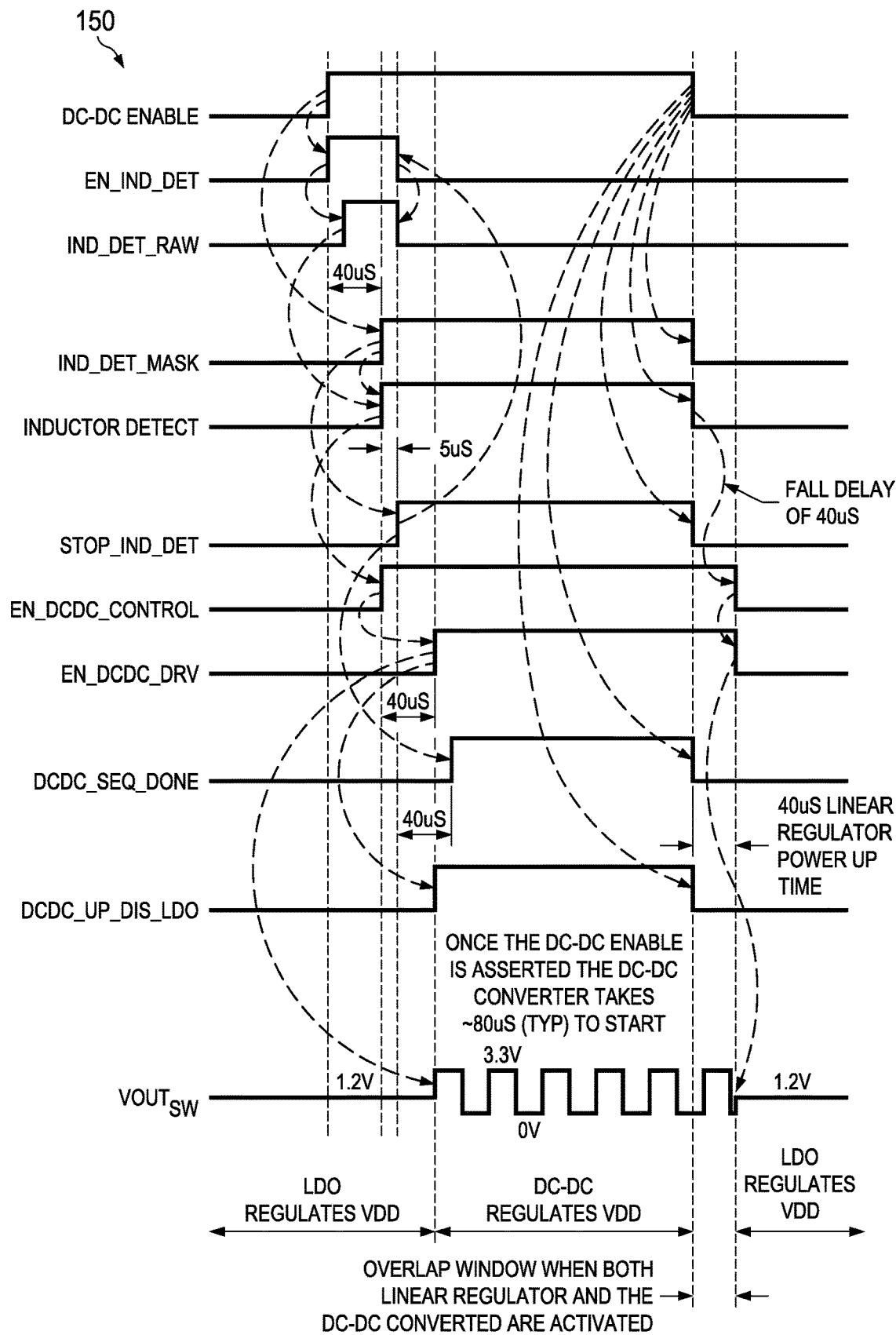
FIG. 3 illustrates a timing diagram for the logic circuit of FIG. 2.

FIG. 2 illustrates an example of a logic circuit 100 that could be employed to control a power control circuit (e.g., the power control circuit 3 of FIG. 1). In some examples, portions (or all) of the logic circuit 100 can be included in the power control circuit, such as in the control logic 9 of FIG. 1. In other examples, some or all portions of the logic circuit 100 can be implemented on an external unit. FIG. 3 illustrates a timing diagram 150 for the signals illustrated and described with respect to FIG. 2. For purposes of simplification of explanation, the same terms are used in FIGS. 2 and 3 to denote the same structures and signals.

The logic circuit 100 can be driven by an enable LDO signal (labeled in FIG. 2 as "LDO ENABLE") and an enable DC-DC signal (labeled in FIGS. 2 and 3 as "DC-DC ENABLE"). The enable LDO signal (LDO ENABLE) can be asserted (e.g., turned high) in situations where the power control circuit is not employing an external power supply. The enable DC-DC signal (DC-DC ENABLE) can be asserted (e.g., turned high) in situations where a transition to a DC-DC mode is needed/desired. The enable LDO signal (LDO enable) and the enable DC-DC signal (DC-DC ENABLE) can both be provided to an input of an AND gate 104. Additionally, a stop inductor detection signal (labeled in FIG. 2 as "STOP_IND_DET") can be provided to a rise delay 106 (e.g., shown in FIGS. 2 and 3 as about a 40 microsecond (μs) rise delay) that can generate a DC-DC sequence done signal (labeled in FIG. 2 as "DCDC_SEQ_DONE"). The stop inductor detect signal (STOP_IND_DET) can be provided to an inverted input of the AND gate 104. The DC-DC sequence done signal (DCDC_SEQ_DONE) and the inductor detect signal (INDUCTOR DETECT) together provide the information indicating whether the power control circuit transitions from the LDO mode to the DC-DC mode.

The rise delay 106 can be controlled by a power on reset signal (labeled in FIGS. 2 and 3 as "PORTZ") that is provided to an inverted control port of the rise delay 106. The output of the AND gate 104 can be an enable inductor detection signal (labeled in FIGS. 2 and 3 as "EN_IND_DET") that can be provided to an inductor detect circuit 108. The power on reset signal (PORZ) can be provided from a power management (PMM) input/output (I/O) supply 107.

The inductor detect circuit 108 can output a raw inductor detection signal (labeled in FIGS. 2 and 3 as "IND_DET_RAW"). The raw inductor detection signal (IND_DET_RAW) can be asserted (e.g., turned high) upon detecting that an inductor (e.g., the inductor 12 of FIG. 1) is present (e.g., conductively coupled to a DC-DC converter and a processor core) and can be de-asserted (e.g., turned low) upon detecting that the inductor is not present (e.g., conductively decoupled to the DC-DC converter and/or the processor core).

The raw inductor detect signal (IND_DET_RAW) can be provided to an input of an AND gate 110. Additionally, the enable DC-DC signal (DC-DC ENABLE) is provided to a rise delay 114 (e.g., that applies a delay of about 40 μs) and is controlled by the power on reset signal (PORZ) which is provided to an inverted control port of the rise delay 114. The output of the rise delay 114 is an inductor detect mask signal (labeled in FIGS. 2 and 3 as "IND_DETMASK"). The inductor detect mask signal (IND_DET_MASK) can be provided to an input of the AND gate 110 and to a rise delay 112 (e.g., a delay of about 5 μs) to generate the stop inductor detection signal (STOP_IND_DET).

The AND gate 110 can output an unlatched inductor detect signal (labeled in FIGS. 2 and 3 as "IND_DET_UNLATCH") that can be provided to an input of a latch 116. In this manner, the inductor detect mask signal (IND_DET_MASK) filters (e.g., prevents) a "false high" glitch (a transient signal) on the raw inductor detect signal (INT_DET_RAW). In particular, when the enable inductor detect signal (EN_IND_DET) is asserted (turned high), and an inductor is not present, a switching output of a DC-DC converter (e.g., the DC-DC converter 8) (labeled in FIGS. 2 and 3 as "VOUT$_{SW}$") can be a floating node with an instantaneous voltage anywhere from VSS$_{SW}$ and VDD$_{SW}$. Until the floating node is discharged to a level below an inductor detector threshold (e.g., by transistors, as explained herein), the raw inductor detect signal (IND_DET_RAW) may remain high, causing the aforementioned "false high" glitch (transient signal). The discharge time (e.g., ~40 μs) of the floating node can be set at the rise delay 114. Accordingly, the inductor detect unlatch signal (IND_DET_UNLATCH) is only asserted when the raw inductor detect signal (INT_DET_RAW) remains high after discharge time. The latch 116 can be a D-type flip-flop that can be reset with an inverted version of the enable DC-DC signal (DC-DC ENABLE). The output of the latch 116 can be an inductor detect signal (labeled in FIGS. 1, 2 and 3 as "INDUCTOR DETECT"). As illustrated and described with respect to FIGS. 2 and 3, the inductor detect signal ("INDUCTOR DETECT") is asserted (e.g., turned high) if the inductor is present. Moreover, as is illustrated in FIGS. 2 and 3, if the inductor is not present (e.g., the inductor has become decoupled by mechanical vibrations) the power control switch does not switch from the LDO mode to the DC-DC mode and other dependent signal (e.g., "EN_DCDC_CONTROL" and "EN_DCDC_DRV") are de-asserted (e.g., turned low).

The inductor detect signal ("INDUCTOR DETECT") can be provided to an input of AND gate 118 and to a fall delay 120 (e.g., of about 40 μs) that can provide a falling delay to the inductor detect signal (INDUCTOR DETECT). The fall delay 120 can be controlled by the power on reset signal (PORZ) that is provided to an inverted control port of the fall delay 120. The fall delay 120 can output an enable DC-DC control signal (labeled in FIGS. 2 and 3 as "EN_DCDC_CONTROL") that can be provided to a DC-DC control circuit 122 and to a rise delay 124. The rise delay 124 can apply a rise delay of about 40 μs to the enable DC-DC control signal (EN_DCDC_CONTROL) and the rise delay 124 can be controlled by the power on signal (PORZ) that is provided to an inverted control port of the rise delay 124.

The rise delay 124 can output an enable DC-DC driver signal (labeled in FIGS. 2 and 3 as "EN_DCDC_DRV"). The enable DC-DC driver signal (EN_DCDC_DRV) can be provided to the AND gate 118 and to a DC-DC drivers and switches circuit 126 (e.g., the DC-DC converter 8 of FIG. 1).

Upon receiving an asserted (e.g., high) enable DC-DC control signal (EN_DCDC_CONTROL) and an asserted (e.g., high) enable DC-DC driver signal (EN_DCDC_DRV) the switching output of the DC-DC converter (e.g., the DC-DC converter 8) (VOUT$_{SW}$) can be output as a square wave that swings between a neutral voltage (e.g., VSS$_{SW}$, ~0 V) and a high voltage (e.g., VDD$_{SW}$, ~3.3 V).

Additionally, the AND gate 118 can output a DC-DC active/disable regulated (linear) voltage signal (labeled in FIGS. 2 and 3 as "DCDC_UP_DIS_LDO"). The DC-DC active/disable regulated (linear) voltage signal (DCDC_UP_DIS_LDO) can be asserted (e.g., high) when power control circuit is operating DC-DC mode. The DC-DC active/disable regulated (linear) voltage signal (DCDC_UP_DIS_LDO) can be employed to enable/disable a linear regulator that outputs a linear voltage ("LDO"). Thus, as illustrated in FIG. 3, the switching output voltage ("VOUT$_{SW}$") is initially a linear voltage 1.2 V, such that the power control circuit is operating in the LDO mode and then the power control circuit transitions to the DC-DC mode. Moreover, as illustrated in FIG. 3, the linear voltage (LDO) is powered downed after DC-DC switching is started. However, if the inductor is not present (as indicated by the inductor detect signal (INDUCTOR DETECT), a DC-DC active/disable regulated (linear) voltage signal (DCDC_UP_DIS_LDO) is not asserted (e.g., stays low) and the power control circuit does not switch to the DC-DC mode. The DC-DC active/disable regulated (linear) voltage signal (DCDC_UP_DIS_LDO) (which signal can also be referred to as a linear output disable signal) can be provided to a linear regulator (e.g., the linear regulator 6 of FIG. 1) to control the outputting of a linear voltage signal (LDO).

More particularly, as illustrated in operation of the logic circuit 100, the DC-DC active/disable regulated (linear) voltage signal (DCDC_UP_DIS_LDO) can be provided to the linear regulator. The linear regulator can be configured to disable an LDO output upon assertion (turning high) of the DC-DC active/disable regulated (linear) voltage signal (DCDC_UP_DIS_LDO). Moreover, as illustrated by the logic circuit 100, if the inductor detect signal (INDUCTOR DETECT) is not asserted, the DC-DC active/disable regulated (linear) voltage signal (DCDC_UP_DIS_LDO) remains low, such that the power control circuit continues to operate in the LDO mode.

It is noted that in operation of the logic circuit 100, the stop inductor detection signal (STOP_IND_DET) turns off further detection of an inductor after a predetermined time after assertion of the enable DC-DC signal (DC-DC ENABLE), namely delay added by a combination of the rise delay 114 and the rise delay 112. The stop inductor detection signal (STOP_IND_DET) prevents the inductor detect circuit 108 from outputting a false value for the raw inductor detect signal (IND_DET_RAW). In particular, once the power control circuit is in DC-DC mode, and the inductor is present, the output of the DC-DC converter swings between $VSS_{SW}$ (~0V) and $VDD_{SW}$ (~3.3V). In this situation, even if the inductor is present and the power control circuit was operating in the DC-DC mode, the inductor detect circuit 108 would intermittently output the raw inductor detect signal (RAW_IND_DET) indicating that the inductor is absent. As illustrated in FIG. 3, the stop inductor detect signal (STOP_IND_DET) is asserted prior to the power control circuit operating in the DC-DC mode.

The enable DC-DC signal (DC-DC ENABLE) may be de-asserted (e.g., turned low), for example, in response to assertion (e.g., turning high) of the power on reset signal (PORZ) or other circumstances. As illustrated in FIG. 3, if the enable DC-DC signal (DC-DC ENABLE) is de-asserted (e.g., turned low), the inductor detect mask (IND_DET_MASK) is also de-asserted (e.g., turned low) and the inductor detect signal (INDUCTOR DETECT) is de-asserted (e.g., turned low). After a delay (e.g., applied by the fall delay 120), the enable DC-DC control signal (EN_DCDC_CONTROL signal) is also de-asserted (e.g., turned low), which causes a corresponding de-assertion of the enable DC-DC driver signal (EN_DCDC_DRV), thereby also causing de-assertion (e.g., turning low) of the DC-DC active/disable regulated (linear) voltage signal (DCDC_UP_DIS_LDO). As is illustrated in FIG. 3, upon de-assertion (e.g., turning low) of the DC-DC active/disable regulated (linear) voltage signal (DCDC_UP_DIS_LDO), the switching output ($VOUT_{SW}$) returns to a linear voltage of 1.2 V, such that the power control circuit operates in the LDO mode.

Further, the logic circuit 100 can be employed in the power control circuit even in situations where the inductor was absent by design. In such power control circuits, by employment of the logic circuit 100, if the enable DC-DC signal (DC-DC ENABLE) signal were inadvertently (or intentionally) asserted (e.g., turned high), the power control circuit would simply not detect the inductor (since the inductor would not be present) and the power control circuit would continue operate in LDO mode seamlessly.

Figure 4:
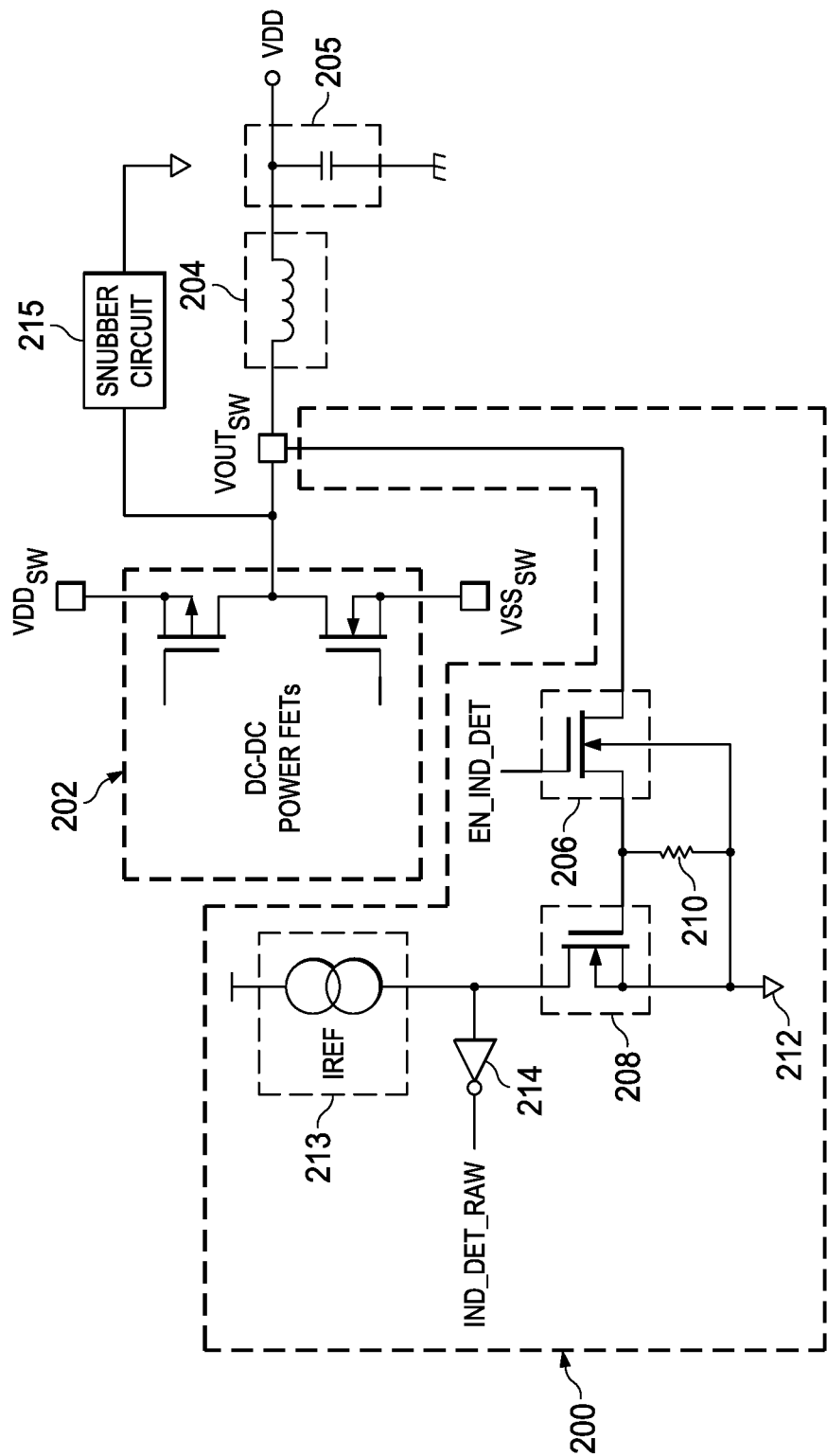
FIG. 4 illustrates a circuit diagram of an inductor detect circuit.

FIG. 4 illustrates an example of an inductor detect circuit 200 that could be employed to implement the inductor detect circuit 108 of FIG. 2 and/or the inductor detect circuit 14 illustrated in FIG. 1. For purposes of simplification of explanation, the same terms are used in FIGS. 2-4 to denote the same structures and signals. Some components of the circuits illustrated in FIG. 4 (including the DC-DC power FETs and the inductor detect circuit 200) can be implemented on an integrated circuit (IC) chip. The inductor detect circuit 200 can be coupled to an output of a set of DC-DC power field effect transistors (FETs) 202. The DC-DC power FETs 202 can be implemented in a DC-DC converter (e.g., the DC-DC converter 8 of FIG. 1). The output of the DC-DC power FETs 202 can be a switching voltage, $VOUT_{SW}$ that is activated in response to a DC-DC driver signal (EN_DCDC_DRV) (e.g., as illustrated in FIGS. 2 and 3). When the switching voltage $VOUT_{SW}$ is active, the switching voltage provides a square wave that swings between $VSS_{SW}$ (e.g., about '0' V) and $VDD_{SW}$ (e.g., about 3.3 V).

The switching voltage, $VOUT_{SW}$ can be coupled to the inductor detect circuit 200 and an external inductor 204 (e.g., external to the IC chip). The inductor 204 can provide an output voltage VDD to components such as a processor core. As noted, the present system (including the inductor detect circuit 200 and the DC-DC power FETs 202) can operate in an environment of application that experiences significant mechanical vibrations (e.g., an automotive vehicle). Thus, in some situations, due to such vibrations, the inductor 204 may become dislodged thereby severing (e.g., decoupling) conductive communication with the DC-DC power FETs 202 and/or another component (e.g., a processor core) driven by an output of the inductor 204. Accordingly, the inductor detect circuit 200 can detect the presence (e.g., the inductor is in properly in conductive communication with the DC-DC power FETs 202) or absence (e.g., the inductor 204 has become conductively de-coupled) of the inductor 204. A capacitor 205 can be coupled to the inductor 204, and the output voltage VDD is provided at the node between the inductor 204 and the capacitor 205.

In particular, the inductor detect circuit 200 can include a first N-channel metal oxide semiconductor field-effect transistor (N-MOS) 206 and a second N-MOS 208. The switching output, $VOUT_{SW}$ can be coupled to a drain (e.g., an input node) of the first N-MOS 206. A source (e.g., an output node) of the first N-MOS 206 can be coupled to a gate (e.g., a control node) of the second N-MOS 208 and to a resistor 210. A threshold voltage of the gate of the second N-MOS 208 can define an inductor detection threshold level. The resistor 210 can have a resistance of about 2.5 kilo-ohms (kΩ). A body of the first N-MOS can be coupled to an electrically neutral node 212 (e.g., ground). A source (e.g., an output node) of the second N-MOS 208 and the resistor 210 can also be coupled to the electrically neutral node 212. A reference current (labeled in FIG. 4 as "IREF") can be coupled to a drain (e.g., an input node) of the second N-MOS 208. The reference current (IREF) can be provided from a constant current source 213. Additionally, the drain (e.g., the input node) of the second N-MOS can be provided to an inverter 214 (e.g., a logic component). The output of the inverter 214 can be a raw inductor detect signal (labeled and described in FIGS. 2-4 as "IND_DET_RAW"). In some examples, a snubber circuit 215 can also be coupled to the switching output $VOUT_{SW}$. In such examples, the snubber circuit 215 can be a simple series RC circuit. The snubber circuit 215 can be employed, for example, to suppress noise in the switching output $VOUT_{SW}$.

A gate (e.g., a control node) of the first N-MOS 206 can be controlled by the enable inductor detect signal (labeled and described in FIGS. 2-4 as "EN_IND_DET"). In operation, the inductor detect circuit 200 operates as a current comparator that compares the reference current, IREF, with the current flowing through the second N-MOS 208. In particular, as described with respect to FIGS. 2-3 upon an enable DC-DC signal (DC-DC ENABLE) being asserted, the enable inductor detect signal (EN_IND_DET) is asserted (e.g., turned high). If the inductor 204 is present, assertion (e.g., turning high) of the inductor detect signal (EN_IND_DET) substantially shorts the output voltage $VOUT_{SW}$ with the output voltage VDD, such that the gate of the second N-MOS 208 to go a high state, thereby dropping the input of the inverter 214 to a low state, such that the output of the inverter 214, which causes the raw inductor detect signal (IND_DET_RAW) to be in a high state (asserted).

Conversely, if the inductor 204 is not present (e.g., the inductor 204 is absent due to mechanical vibrations) and the inductor detect signal (EN_IND_DET) is asserted (high state), $VOUT_{SW}$ is pulled to a low state (e.g., about 0 V) by the resistor 210. Moreover, in this state, the gate of the second N-MOS 208 is also pulled to the low state, such that the input to the inverter is in a high state, thereby causing the raw inductor detect signal (IND_DET_RAW) to be in a low state (de-asserted).

As is illustrated in FIG. 4, the inductor detect circuit 200 can accurately detect the presence or absence of the inductor 204 and provide a raw inductor detect signal (IND_DET_RAW) (which can also be referred to simply as an inductor detection signal) that characterizes the presence or absence of the inductor 204. Moreover, as illustrated, the inductor detect circuit 200 does not need expensive components, such as a high frequency oscillator to detect the presence or absence of the inductor 204. In this manner, as described herein, a system employing the inductor detect circuit 200 can switch power modes from an LDO mode to a DC-DC mode to achieve greater power efficiency as long as the inductor 204 has not been dislodged/decoupled from the output of the DC-DC power FETs and/or a component being powered (e.g., a processor core).

As also explained with respect to FIGS. 2 and 3, in some situations, the raw inductor detect signal (IND_DET_RAW) may provide a "false high" glitch (e.g., transient signal). For instance, immediately after the enable inductor detect signal (EN_IND_DET) is asserted (turned high), the switching output $VOUT_{SW}$ can be a "floating node" anywhere between $VSS_{SW}$ and $VDD_{SW}$, which may be above the inductor detection threshold level that causes the raw inductor detect signal (IND_DET_RAW) to temporarily be asserted (turned high) whether or not the inductor 204 is present. Thus, the inductor detect mask signal (IND_DET_MASK) of the logic circuit 100 described in FIGS. 2 and 3 applies a delay (e.g., 40 μs) to ensure sufficient discharge time is provided before the inductor detect signal (INDUCTOR DETECT) can be asserted (turned high).

Furthermore, the operation of the logic circuit 100 ensures that the operation of the inductor detect circuit 200 is substantially independent of the value of the inductor 204 and/or other external components, such as the snubber circuit 215 (e.g., a series RC circuit). For instance, assertion of the enable inductor detect signal (EN_IND_DET) causes the snubber circuit 215 to discharge from $VDD_{SW}$ to around 0V (or at least below the inductor detection threshold) within the delay time applied for the inductor detect mask signal (IND_DET_MASK). Thus, even false highs (transient signals) caused by the snubber circuit 215 (or similar components) do not cause the inductor detect signal (INDUCTOR DETECT) to be false.

Still further, as explained with respect to FIGS. 2 and 3, the DC-DC driver signal (EN_DCDC_DRV) is disabled (turned low) until the inductor detect signal (INDUCTOR DETECT) signal is asserted (turned high). In this manner, the DC-DC power FETs 202 remain in the "off" state while the inductor detect circuit 200 is detecting the presence or absence of the inductor 204.

Figure 5:
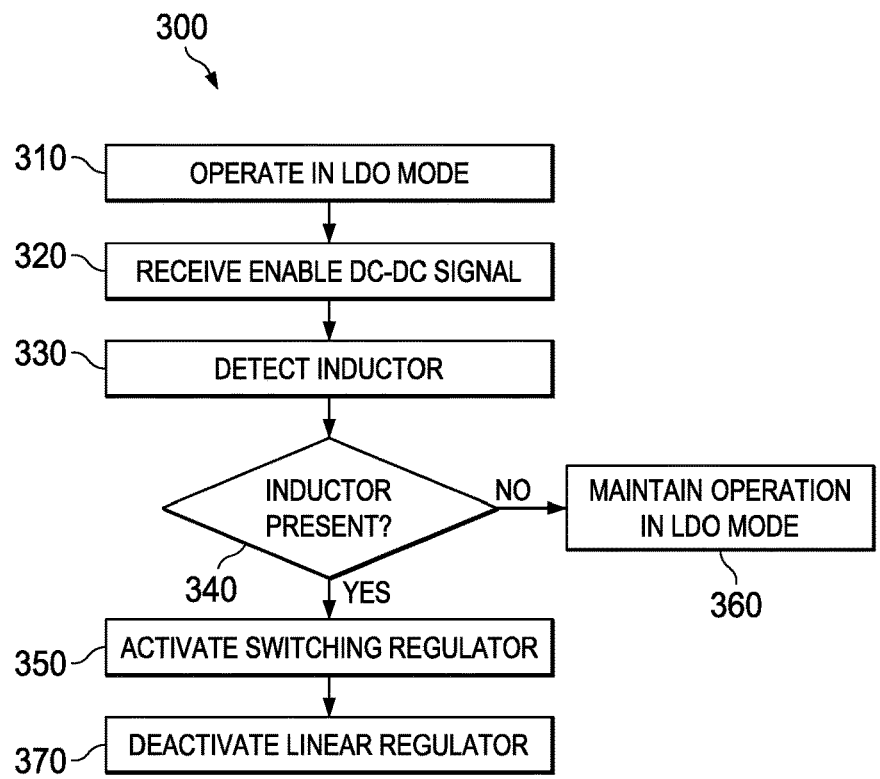
FIG. 5 illustrates a flowchart of an example method for controlling a power control circuit.

In view of the foregoing structural and functional features described above, an example method will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 5 can be implemented on an IC chip (e.g., a power control circuit).

At 310, a power control circuit (e.g., the power control circuit 3 of FIG. 1) can be operating in LDO mode, such that an LDO voltage signal (VDD) is output by the power control circuit. At 320, the power control circuit can receive an asserted (e.g., high) enable DC-DC signal. The enable DC-DC signal may be asserted, for example, to achieve greater power efficiency.

At 330, an inductor detect circuit (e.g., the inductor detect circuit 14 illustrated in FIG. 1 and/or the inductor detect circuit 200 illustrated in FIG. 4) can detect whether an inductor (e.g., the inductor 12 of FIG. 1 and/or the inductor 204 of FIG. 4) is present. For example, the inductor detect circuit can sense whether the LDO voltage signal, VDD, is shorted with the output of a DC-DC converter (e.g., the DC-DC converter 8 of FIG. 1), $VOUT_{SW}$. At 340, a determination can be made as to whether the inductor is present based on an inductor detect signal provided from the inductor detect circuit. For instance, if VDD is shorted with $VOUT_{SW}$ (as indicated in 340), the inductor detect signal can indicate that the inductor is present, such that the determination at 340 is positive (e.g., YES). If the determination at 340 is positive (e.g., YES), the method 300 can proceed to 350. Conversely, if VDD is not shorted with $VOUT_{SW}$ (e.g., as indicated in 330), the inductor detect signal can indicate that the inductor is not present (e.g., the inductor has become dislodged due to vibrations), such that the determination at 340 is negative (e.g., NO). If the determination is negative (e.g., NO) the method 300 can proceed to 360.

At 350, the DC-DC converter can be activated, such that the DC-DC converter outputs a switching voltage ($VOUT_{SW}$). At 370, a linear regulator that outputs the LDO voltage signal (VDD) can be deactivated.

At 360, the power control circuit can maintain operation in the LDO mode. Thus, at 360, the DC-DC converter is not activated.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
   an input;
   an enable input:
   a first resistor having a first terminal and a second terminal;
   a current source;
   a first transistor including:
      a first control terminal coupled to the enable input;
      a first body terminal coupled to ground;
      a first current terminal coupled to the input; and
      a second current terminal coupled to the first terminal of the first resistor; and
   a second transistor including:
      a second control terminal coupled to the first terminal of the first resistor;
      a second body terminal coupled to ground;
      a third current terminal coupled to the current source; and
      a fourth current terminal coupled to the second terminal of the first resistor.

2. The circuit of claim 1, further comprising:
   a snubber circuit coupled to the first current terminal.

3. The circuit of claim 2, wherein:
   the snubber circuit includes a second resistor coupled in series with a first capacitor and a ground.

4. The circuit of claim 1, further comprising:
   an inverter including an input terminal and an output terminal, the input terminal coupled to the third current terminal.

5. The circuit of claim 4, further comprising:
   an inductor including a first inductor terminal and a second inductor terminal, the first inductor terminal coupled to the first current terminal; and
   a first output signal on the output terminal.

6. The circuit of claim 5, wherein:
   the second inductor terminal is coupled to a capacitor.

7. The circuit of claim 4, further comprising:
   an inductor not directly coupled to the first current terminal; and
   a second output signal on the output terminal.

8. The circuit of claim 1, further comprising:
   a DC-DC converter coupled to the first terminal.

9. A circuit comprising:
   a DC-DC converter;
   a detect circuit coupled to the DC-DC converter, the detect circuit comprising:
      an input coupled to the DC-DC converter;
      an enable input;
      a first resistor having a first terminal and a second terminal;
      a current source;
      a first transistor including:
         a first control terminal coupled to the enable input;
         a first current terminal coupled to the input; and
         a second current terminal coupled to the first terminal of the first resistor; and
      a second transistor including:
         a second control terminal coupled to the first terminal of the first resistor;
         a third current terminal coupled to the current source; and
         a fourth current terminal coupled to the second terminal of the first resistor and to ground, wherein the first transistor further includes a first body terminal coupled to ground; and the second transistor further includes a second body terminal coupled to ground.

10. The circuit of claim 9, wherein:
    the first control terminal is coupled to receive an enable signal.

11. The circuit of claim 9, further comprising:
    a snubber circuit coupled to the first current terminal.

12. The circuit of claim 11, wherein:
    the snubber circuit includes a second resistor coupled in series with a capacitor and a ground.

13. The circuit of claim 9, wherein the detect circuit further comprises:
    an inverter including an input terminal and an output terminal, the input terminal coupled to the third current terminal.

14. The circuit of claim 13, further comprising:
    an inductor including a first inductor terminal and a second inductor terminal, the first inductor terminal coupled to the first current terminal; and
    a first output signal on the output terminal.

15. The circuit of claim 14, wherein:
    the second inductor terminal is coupled to a capacitor.

16. The circuit of claim 13, further comprising:
    an inductor not directly coupled to the first current terminal; and
    a second output signal on the output terminal.

17. The circuit of claim 9, wherein the DC-DC converter coupled to the first terminal.

* * * * *